United States Patent
Stockum et al.

(10) Patent No.: US 8,143,172 B2
(45) Date of Patent: Mar. 27, 2012

(54) PRINTABLE ETCHING MEDIA FOR SILICON DIOXIDE AND SILICON NITRIDE LAYERS

(75) Inventors: Werner Stockum, Reinheim (DE); Armin Kuebelbeck, Bensheim (DE); Jun Nakanowatari, Sagamihara (JP)

(73) Assignee: Merck Patent GmbH, Darmstadt (DE)

( * ) Notice: Subject to any disclaimer, the term of this patent is extended or adjusted under 35 U.S.C. 154(b) by 932 days.

(21) Appl. No.: 11/995,618

(22) PCT Filed: Jun. 21, 2006

(86) PCT No.: PCT/EP2006/005937
§ 371 (c)(1),
(2), (4) Date: Jan. 14, 2008

(87) PCT Pub. No.: WO2007/009546
PCT Pub. Date: Jan. 25, 2007

(65) Prior Publication Data
US 2008/0200036 A1 Aug. 21, 2008

(30) Foreign Application Priority Data
Jul. 15, 2005 (DE) .......... 10 2005 033 724

(51) Int. Cl.
*H01L 21/302* (2006.01)
(52) U.S. Cl. ......... 438/745; 438/757; 216/28; 216/31; 216/37; 216/96; 216/108; 252/79.1; 252/79.4

(58) Field of Classification Search .......... 438/745, 438/757; 216/28, 31, 37, 96, 108, 109; 252/79.1, 252/79.4
See application file for complete search history.

(56) References Cited

U.S. PATENT DOCUMENTS

| | | | | |
|---|---|---|---|---|
| 5,457,057 A | * | 10/1995 | Nath et al. | 438/67 |
| 5,688,366 A | * | 11/1997 | Ichinose et al. | 438/754 |
| 6,337,029 B1 | * | 1/2002 | Hardy et al. | 216/31 |
| 2003/0160026 A1 | * | 8/2003 | Klein et al. | 216/83 |
| 2004/0242019 A1 | | 12/2004 | Klein et al. | |

FOREIGN PATENT DOCUMENTS

| | | | |
|---|---|---|---|
| EP | 0503015 | * | 9/1990 |
| EP | 1 378 948 A | | 1/2004 |
| GB | 1 145 404 A | | 3/1969 |
| WO | WO 01/83391 A | | 11/2001 |
| WO | WO 2005/050673 A | | 6/2005 |

* cited by examiner

*Primary Examiner* — Nadine G Norton
*Assistant Examiner* — Maki Angadi
(74) *Attorney, Agent, or Firm* — Millen, White, Zelano & Branigan, P.C.

(57) ABSTRACT

The present invention relates to a novel printable etching medium having non-Newtonian flow behavior for the etching of surfaces in the production of solar cells, and to the use thereof. The present invention furthermore also relates to etching and doping media which are suitable both for the etching of inorganic layers and also for the doping of underlying layers. In particular, they are corresponding particle-containing compositions by means of which extremely fine structures can be etched very selectively without damaging or attacking adjacent areas.

17 Claims, No Drawings

PRINTABLE ETCHING MEDIA FOR SILICON DIOXIDE AND SILICON NITRIDE LAYERS

The present invention relates to novel compositions in the form of printable etching media having non-Newtonian flow behaviour for the etching of surfaces in applications for the production of solar cells, and to the use thereof. The present invention furthermore also relates to compositions in the form of etching and doping media which are suitable both for the etching of extremely fine lines or structures in inorganic layers and also for the doping of underlying layers. In particular, they are corresponding particle-containing compositions by means of which extremely fine lines and structures can be etched very selectively without damaging or attacking adjacent areas.

PRIOR ART AND OBJECT OF THE INVENTION

During the process for the production of solar cells, it is necessary, inter alia, to structure oxide layers on a support material. A crystalline silicon solar cell usually consists of a p-conducting substrate, into which a homogeneously thick layer of an n-conducting substance, for example phosphorus, is diffused on the front. A metallically conducting contact is applied to the front and back of the wafer in order to conduct away the current produced on incidence of light. With a view to an inexpensive production method which is suitable for mass production, the contact is usually produced by screen printing.

Besides the oxide layers that have to be structured during solar cell production, silicon nitride layers also have to be etched. For etching corresponding nitride layers, the methods used have to be modified and the etching pastes adapted in a suitable manner.

The surfaces of crystalline silicon solar cells are coated with thin inorganic layers during the production process, and optionally also after the end thereof. These layers have thicknesses in the range from 20 to 200 nm, in most cases in the range from 50 to 150 nm.

During the process for the production of crystalline silicon solar cells, it is therefore advantageous in a number of process steps to etch fine lines into these inorganic layers of the solar cell.

These openings in the surface of the solar cell can be used, for example, for the production of a so-called selective emitter, also known as 2-stage emitter. To this end, a high degree of n-doping, preferably by means of phosphorus diffusing in, is produced in a subsequent diffusion step in the partial openings of a diffusion barrier located on the silicon.

In the present description, the term inorganic surfaces is taken to mean oxidic and nitride-containing compounds of silicon, in particular silicon oxide and silicon nitride surfaces. The mode of action of such diffusion barriers is known to the person skilled in the art and is described in the literature [A. Goetzberger; B. Voβ; J. Knobloch, Sonnenenergie: Photovoltaik [Solar Energy: Photovoltaics], Teubner Studienbücher Stuttgart 1997, pp 40; 107]. These diffusion barriers can be produced in a variety of ways:

Very dense silicon dioxide layers are obtained, for example, by heat treatment of silicon in an oxygen-containing atmosphere at temperatures in the region of 900° C. (thermal oxide).

Also known to the person skilled in the art is the deposition of silicon dioxide by CVD processes. Depending on the way the reaction is carried out, a distinction is made here between, inter alia, the following processes:

APCVD (atmospheric pressure CVD)
PE-CVD (plasma enhanced CVD)
LP-CVD (low pressure CVD)

A common feature of these processes is that the desired inorganic compound is obtained from the gas phase of a volatile precursor, for example silane ($SiH_4$) or TEOS (tetraethyl orthosilicate) in the case of silicon dioxide, by deposition of the precursor on the target substrate with decomposition.

Silicon dioxide layers which form a diffusion barrier can also be obtained by means of wet-chemical coating with a liquid or dissolved solid pre-cursor in a solvent or solvent mixture. These liquid systems are usually applied to the substrate to be coated by spin coating. These systems are known to the person skilled in the art as spin-on-glass (SOG).

In many cases, the $SiO_2$ layer applied also remains as reflection-reducing passivation layer. This is particularly frequently the case for thermally grown $SiO_2$.

Silicon nitride layers are used less as diffusion barriers in the art of crystalline solar cells, although they are in principle likewise suitable for this purpose. Silicon nitride layers are mainly used as passivation and anti-reflection layers.

It is also advantageous in the production of crystalline silicon solar cells to be able to produce openings in a targeted manner in the silicon nitride layers. An example which may be mentioned here is the application of electrically conductive pastes. These metal pastes are usually "fired through" the silicon nitride layer at temperatures in the region of 600° C., facilitating an electrical contact to the emitter layer. Due to the high temperatures, polymer-based (epoxy or phenolic resin) metallisation pastes cannot be used. Crystal defects and metallic contamination in the underlying silicon also arise in the "fire-through process". Due to the system, the passivation layer is additionally completely destroyed by the overlying printed-on metal paste. A partial, narrower opening of the silicon nitride layer for electrical contacting would be more advantageous, with retention of the passivation layer in the edge regions, which are covered by the overlying metallisation layer.

Besides the pure diffusion barriers consisting of silicon dioxide or silicon nitride, it is also possible to use thin glass layers in the production of crystalline silicon solar cells.

Definition of Glass:

Glass is taken to mean per se a homogeneous material, for example quartz, window glass, borosilicate glass, and also thin layers of these materials produced on other substrates (for example ceramics, metal sheets, silicon wafers) by various processes known to the person skilled in the art (CVD, PVD, spin-on, thermal oxidation, inter alia).

The term glasses below is taken to mean silicon oxide- and silicon nitride-containing materials which are in the solid amorphous physical state without crystallisation of the glass components and which have a high degree of structural disorder in the microstructure owing to the lack of long-range order.

Besides pure $SiO_2$ glass (quartz), all glasses (for example doped glasses, such as borosilicate, phosphosilicate and borophosphosilicate glasses, coloured, milk and crystal glasses, optical glasses) which comprise $SiO_2$ and other components, in particular elements such as, for example, calcium, sodium, aluminium, lead, lithium, magnesium, barium, potassium, boron, beryllium, phosphorus, gallium, arsenic, antimony, lanthanum, zinc, thorium, copper, chromium, manganese, iron, cobalt, nickel, molybdenum, vanadium, titanium, gold, platinum, palladium, silver, cerium, caesium, niobium, tantalum, zirconium, neodymium, praseodymium, which occur in the glasses in the form of oxides, carbonates, nitrates, phosphates, sulfates and/or halides or function as doping elements in the glasses, are also encompassed. Doped glasses are, for example, borosilicate, phosphosilicate, borophosphosilicate, coloured, milk and crystal glasses and optical glasses. The silicon nitride may likewise comprise other elements, such as boron, aluminium, gallium, indium, phosphorus, arsenic or antimony.

Definition of silicon oxide- and silicon nitride-based systems: Silicon oxide-based systems are defined below as all crystalline systems which do not fall under the definition of amorphous $SiO_2$ glasses given above and are based on silicon dioxide; these can be, in particular, the salts and esters of orthosilicic acid and condensation products thereof—generally known as silicates by the person skilled in the art—as well as quartz and glass-ceramics.

Furthermore, other silicon oxide- and silicon nitride-based systems, in particular the salts and esters of orthosilicic acid and condensation products thereof, are encompassed. Besides pure $SiO_2$ (quartz, tridymite, cristobalite), all $SiO_2$-based systems built up from $SiO_2$ or "discrete" and/or linked [$SiO_4$] tetrahedra, such as, for example, mesosilicates, sorosilicates, cyclosilicates, inosilicates, phyllosilicates, tectosilicates, and comprising other components, in particular elements/components such as, for example, calcium, sodium, aluminium, lithium, magnesium, barium, potassium, beryllium, scandium, manganese, iron, titanium, zirconium, zinc, cerium, yttrium, oxygen, hydroxyl groups and halides, are also encompassed.

Silicon nitride-based systems are defined below as all crystalline and partially crystalline (usually referred to as microcrystalline) systems which do not fall under the definition given above for the amorphous silicon nitride glasses/layers. These include $Si_3N_4$ in its $\alpha$-$Si_3N_4$ and $\beta$-$Si_3N_4$ modifications and all crystalline and partially crystalline $SiN_x$ and $SiN_x$:H layers. Crystalline silicon nitride may comprise other elements, such as boron, aluminium, gallium, indium, phosphorus, arsenic and antimony.

Etching of Structures

The use of etchants, i.e. chemically aggressive compounds, results in the dissolution of the material exposed to the etchant attack. In most cases, the aim is completely to remove the layer to be etched. The end of the etching is reached by the encountering of a layer which is substantially resistant to the etchant. In addition, there is the process known to the person skilled in the art of partial removal of a layer by etching to a target thickness which is usually defined.

Etching of structures on silicon oxide- and silicon nitride-based glasses and other silicon oxide- and silicon nitride-based systems:

According to the current state of the art, any desired structures can be etched selectively in silicon oxide- and silicon nitride-based glasses and other silicon oxide- and silicon nitride-based systems or surfaces thereof and layers thereof of variable thickness directly by laser-supported etching methods or, after masking, by wet-chemical methods ([1] D. J. Monk, D. S. Soane, R. T. Howe, Thin Solid Films 232 (1993), 1; [2] J. Bühler, F.-P. Steiner, H. Baltes, J. Micromech. Microeng. 7 (1997), R1) or by dry-etching methods ([3] M. Köhler "Ätzverfahren für die Mikrotechnik" [Etching Methods for Microtechnology], Wiley VCH 1983).

In the laser-supported etching methods, the laser beam scans the entire etching pattern on the glass dot by dot or line by line in the case of vector-orienting systems, which, besides a high degree of precision, also requires considerable adjustment effort and time.

The wet-chemical and dry-etching methods include material-intensive, time-consuming and expensive process steps:

A. Masking of the Areas not to be Etched, for Example by:
  photolithography: Production of a negative or positive of the etching structure (depending on the resist), coating of the substrate surface (for example by spin-coating with a liquid photoresist), drying of the photoresist, exposure of the coated substrate surface, development, rinsing, optionally drying B. Etching of the Structures by:
  dip methods (for example wet etching in wet-chemistry benches): dipping of the substrates into the etching bath, etching operation, repeated rinsing in $H_2O$ cascade sinks, drying
  spin-on or spray methods: the etching solution is applied to a rotating substrate, the etching operation can be carried out without/with input of energy (for example IR or UV irradiation), this is followed by rinsing and drying
  dry-etching methods, such as, for example, plasma etching, in expensive vacuum units or etching with reactive gases in flow reactors C. Removal of the Photoresist:
  In a final process step, the photoresist covering the protecting areas of the substrate must be removed. This can be carried out by means of solvents, such as, for example, acetone, or dilute aqueous alkaline solutions. The substrates are finally rinsed and dried.

Full-area etching of silicon oxide- and silicon nitride-based glasses and other silicon oxide- and silicon nitride-based systems:

In order to etch silicon oxide- and silicon nitride-based glasses and other silicon oxide- and silicon nitride-based systems and layers of variable thickness thereof over the entire area completely or only to a certain depth, use is predominantly made of wet-etching methods. The silicon oxide- and silicon nitride-based glasses and other silicon oxide- and silicon nitride-based systems and layers of variable thickness thereof are dipped into etching baths, which usually contain the toxic and highly caustic hydrofluoric acid and optionally additives of other mineral acids.

The disadvantages of the etching methods described lie in the time-consuming, material-intensive and expensive process steps which are in some cases complex in technological and safety terms and are frequently carried out discontinuously.

International Application WO 01/83391 A describes etching media in the form of printable, homogeneous, particle-free etching pastes having non-Newtonian flow behaviour for the etching of inorganic, glass-like amorphous or crystalline surfaces, in particular of glasses or ceramics, preferably $SiO_2$— or silicon nitride-based systems, and the use of these etching media. In particular on printing of surfaces, use of these particle-free media gave rise to problems due to inadequate resilience of the printed lines, dots or structures (inadequate structure fidelity), meaning that a significant broadening of the originally printed lines occurs (bleeding of the etching species on the substrate).

U.S. Pat. No. 5,688,366 A uses particle-containing etching pastes for etching a transparent conductive layer (for example ITO). The etching pastes used are prepared from molten iron chloride containing water of crystallisation, glycerol and polymer particles. These compositions are suitable for etching lines having a width of about 1 mm. Experiments have shown that these etching pastes are not suitable for etching very thin lines having a width of less than 1 mm cleanly and without flaws, irrespective of whether polymer particles having a diameter of 0.01 µm or of 30 µm are employed for the preparation of the pastes.

OBJECTIVE

The object of the present invention is therefore to provide novel, inexpensive etching pastes for etching very uniform thin lines having a width of less than 100 µm, in particular of less than 80 µm, and extremely fine structures on silicon dioxide and/or silicon nitride layers which are located on silicon solar cells. A further object of the present invention is to provide novel etching media which can be removed from the treated surfaces after the etching, if necessary under the action of heat, in a simple manner without leaving residues.

DESCRIPTION OF THE INVENTION

More recent experiments have now shown that, contrary to experience to date, the technical printing properties of etching pastes can advantageously be improved if suitable, selected finely particulate powders are added. The addition of inorganic, finely particulate powders has proven particularly suitable. These can be incorporated into the etching media together with suitable polymer particles. In particular, inorganic powders can be incorporated together with polymer particles which form a network in the resultant pastes by physical interaction and/or chemical reaction with the other constituents of the medium, at the same time resulting in an increase in the viscosity of the composition. Entirely unexpectedly, the added polymer particles contribute to an improvement in the printability of the medium, while the added inorganic particles have an advantageous effect on the subsequent cleaning step.

Accordingly, the present object is achieved through the use of corresponding powders in compositions for the etching of inorganic, glass-like or crystalline surfaces selected from the group of glasses based on silicon oxide and glasses based on silicon nitride.

Given a suitable choice of the added particulate components, it may even be possible completely to omit the addition of a thickener, which is usually homogeneously distributed in known particle-free pastes. Contrary to all expectations and surprisingly for the person skilled in the art, the compositions according to the invention in the form of pastes can be printed to give extremely fine, uniform and homogeneous lines and structures.

The object of the present application is therefore also achieved by the provision of a novel printable composition in the form of a paste for the etching of inorganic, glass-like or crystalline surfaces selected from the group of glasses based on silicon oxide and glasses based on silicon nitride, which comprises inorganic, finely particulate powders and optionally polymer powders consisting of a material selected from the group polystyrene, polyacrylate, polyamide, polyimide, polymethacrylate, melamine resin, urethane resin, benzoguanine resin, phenolic resin, silicone resin, fluorinated polymers (PTFE, PVDF, inter alia) and micronised wax, in the presence of at least one etching component, solvents, thickeners, optionally at least one inorganic and/or organic acid, and optionally additives, such as antifoams, thixotropic agents, flow-control agents, deaerators, adhesion promoters, and which is active at temperatures in the range from 30 to 500° C. or can optionally be activated by input of energy. Preferred groups of particles which are used in the etching compositions according to the invention in the form of pastes are recited in the claims. Features of the compositions prepared using the finely particulate powders are recited in the claims. The present invention furthermore relates to a process for the etching of inorganic, glass-like, crystalline surfaces such as recited in the claims.

DETAILED DESCRIPTION OF THE INVENTION

Experiments have shown that the use of finely particulate powders in etching compositions in the form of pastes enables both the behaviour of the pastes during the printing process and also the achievable etching result to be significantly improved. Surprisingly, it has been found that the addition of selected finely particulate powders may considerably improve the edge sharpness of the etched lines or structures, but also favourably influences the properties of the compositions with respect to the stability of the printed lines or structures.

The present invention thus relates, in particular, to the use of finely particulate inorganic and/or organic powders in compositions for the etching of inorganic, glass-like or crystalline surfaces selected from the group of glasses based on silicon oxide and glasses based on silicon nitride, in particular corresponding layers which are of importance in photovoltaics.

The present invention thus also relates, in particular, to compositions in the form of a printable etching paste for the etching and optionally for the doping of inorganic glass-like or crystalline layers selected from the group of glasses based on silicon dioxide and glasses based on silicon nitride, which are located on crystalline or amorphous silicon surfaces, in which a) at least one etching component,
b) at least one solvent,
c) at least one inorganic powder in the form of finely particulate graphite and/or carbon black, and optionally finely particulate organic powder in the form of finely particulate plastic powders selected from the group of polystyrenes, polyacrylates, polyamides, polyimides, polymethacrylates, melamine resin, urethane resin, benzoguanine resin, phenolic resin, silicone resins, micronised cellulose and fluorinated polymers (PTFE, PVDF), and optionally micronised wax,
   and optionally inorganic particles from the group aluminium oxides, calcium fluoride, boron oxide, sodium chloride,
d) at least one fluxing agent additive,
e) optionally a homogeneously dissolved organic thickener,
f) optionally at least one inorganic and/or organic acid, and optionally
g) additives, such as antifoams, thixotropic agents, flow-control agents, deaerators, adhesion promoters,
are present.

In accordance with the invention, corresponding printable etching media comprise, in particular, at least one inorganic powder in the form of finely particulate graphite and/or carbon black and/or finely particulate organic powder in the form of finely particulate plastic powders selected from the group polystyrenes, polyacrylates, polyamides, polyimides, polymethacrylates, melamine resin, urethane resin, benzoguanine resin, phenolic resin, silicone resins, micronised cellulose, fluorinated polymers (PTFE, PVDF) and optionally micronised waxes,
and optionally inorganic particles selected from the group aluminium oxide, calcium fluoride, boron oxide, sodium chloride.

Particularly suitable in accordance with the invention are compositions which comprise an inorganic powder whose particles have a relative diameter of <5 µm.

Finely particulate organic powders present therein can have a relative particle diameter in the range from 10 nm to 50 µm. However, preference is given to the incorporation into the media of organic powders having a relative particle diameter in the range from 100 nm to 30 µm and very particularly preferably from 1 µm to 10 µm.

Depending on the desired area of application, the etching media may comprise powders in an amount of 1 to 80% by weight, based on the total amount. For the printing and etching of thin lines and fine structures, use can be made of etching media which comprise powders in an amount of 10 to 50% by weight, in particular in an amount of 20 to 40% by weight, based on the total amount, where inorganic powder having a relative particle diameter of <5 µm is advantageously present therein in an amount of at least 0.5 to 5% by weight, based on the total amount of the etching medium.

The etching media according to the invention comprise at least one etching component. It has been found in practice that suitable etching media may comprise one or more etching components in an amount of 12 to 30% by weight, based on the total amount. Good results are achieved with etching media in which the latter are present in an amount in the range from 2 to 20% by weight. Particular preference is given to the use of media in which the proportion of etching components is in the range from 5 to 15% by weight, based on the total amount, since these compositions result in very selective etching results at the desired high etching rates.

The particulate powders added to the compositions effect an increase in the viscosity. This is associated with improved printing properties and the possibility of printing and etching finer lines and structures. Since the compositions applied to the surfaces to be treated after printing during the etching process have a lower tendency to bleed, more precise lines can be etched. This is all the more surprising since earlier attempts to use particulate thickeners in the compositions gave qualitatively unsuitable etching results. The more recent experiments have now shown that added finely particulate powders and the other components must interact with one another in such a way that, after intensive mixing of the individual components, a homogeneous mixture is formed which has a suitable viscosity which facilitates simple printing of the pastes, but no longer allows bleeding.

In order to adjust the viscosity and in order to achieve an advantageous printing behaviour, additional thickeners may be incorporated into the etching media in an amount of 0.5-25% by weight, based on the total amount. These can be one or more homogeneously dissolved thickeners from the group
cellulose/cellulose derivatives and/or
starch/starch derivatives and/or
polyvinylpyrrolidone
polymers based on acrylates or functionalised vinyl units.

Preference is given to the addition of thickeners in an amount of 3 to 20% by weight, based on the total amount of the etching medium.

As is known from the literature, various etching media components which have an etching action are also suitable for the doping of semiconductor layers. It has therefore proven advantageous for the printable etching paste compositions according to the invention to comprise one or more forms of phosphoric acid, phosphoric acid salts or compounds which are decomposed to the corresponding phosphoric acid on heating. Since doping by the phosphoric acids can also occur at very high temperatures, this has the advantage that etching and subsequent doping of the underlying, exposed layer can be carried out directly successively through the use of only one composition.

The present invention thus relates to a composition in the form of a paste which comprises at least one inorganic mineral acid selected from the group hydrochloric acid, phosphoric acid, sulfuric acid and nitric acid as etching component and/or optionally at least one organic acid, which may contain a straight-chain or branched alkyl radical having 1-10 C atoms, selected from the group of the alkylcarboxylic acids, the hydroxycarboxylic acids and the dicarboxylic acids. Suitable organic acids are those selected from the group formic acid, acetic acid, lactic acid and oxalic acid.

In total, the proportion of the organic and/or inorganic acids in the compositions according to the invention in the form of etching pastes can be in a concentration range from 0 to 80% by weight, based on the total amount of the medium. It has proven advantageous for the added acids each to have a $pK_a$ value of between 0 and 5.

Besides water, solvents which may be present in the etching medium composition according to the invention are mono- or polyhydric alcohols, such as glycerol, 1,2-propanediol, 1,4-butanediol, 1,3-butanediol, 1,5-pentanediol, 2-ethyl-1-hexenol, ethylene glycol, diethylene glycol and dipropylene glycol, and ethers thereof, such as ethylene glycol monobutyl ether, triethylene glycol monomethyl ether, diethylene glycol monobutyl ether and dipropylene glycol monomethyl ether, and esters, such as [2,2-butoxy(ethoxy)] ethyl acetate, esters of carbonic acid, such as propylene carbonate, ketones, such as acetophenone, methyl-2-hexanone, 2-octanone, 4-hydroxy-4-methyl-2-pentanone and 1-methyl-2-pyrrolidone, as such or in the form of a mixture, in an amount of 10 to 90% by weight, preferably in an amount of 15 to 85% by weight, based on the total amount of the medium.

In use, it has proven advantageous for the etching paste compositions, apart from the components mentioned hitherto, to comprise additives selected from the group antifoams, thixotropic agents, flow-control agents, deaerators, and adhesion promoters for improving the properties. Based on the total amount, 0 to 5% by weight of additives may be present in the composition employed by the user.

An essential property of the compositions according to the invention is their viscosity. The viscosity is generally usually defined as the material-dependent proportion of the frictional resistance which counters the movement when adjacent liquid layers are displaced. According to Newton, the shear resistance in a liquid layer between two sliding surfaces arranged parallel and moved relative to one another is proportional to the velocity or shear gradient G. The proportionality factor is a material constant which is known as the dynamic viscosity and has the dimension m Pa·s. In Newtonian liquids, the proportionality factor is pressure- and temperature-dependent. The degree of dependence here is determined by the material composition. Liquids or substances having an inhomogeneous composition have non-Newtonian properties. The viscosity of these substances is additionally dependent on the shear gradient.

In industrial use, it has been found that the etching pastes according to the invention have particularly good properties if they have, owing to their overall composition, a viscosity at 20° C. in the range from 6 to 35 Pa·s at a shear rate of 25 $s^{-1}$, preferably in the range from 10 to 25 Pa·s at a shear rate of 25 $s^{-1}$ and especially at 15 to 20 Pa·s at a shear rate of 25 $s^{-1}$.

As already mentioned above, it has proven advantageous, in contrast to previous knowledge, for inorganic and/or organic finely particulate powders, which also contribute to thickening of the media, to be added to the etching pastes according to the invention. WO 01/83391 A also describes particle-free etching media for the etching of fine structures and lines <100 µm in which homogeneously dispersed polymer serves for the thickening. In the meantime, it has been found that the addition of suitable finely particulate inorganic and/or organic powders enables particularly thin lines to be printed and etched. Particularly suitable for this purpose are polymer particles which interact with the other components of the composition and form a network by means of chemical bonds or a purely physical interaction at the molecular level. The relative particle diameters of these systems can be in the range from 10 nm to 30 µm. Corresponding polymer particles having a relative particle diameter in the range from 1 to 10 µm have proven particularly advantageous. Particles which are particularly suitable for the purpose according to the invention can consist of the following materials:

polystyrene
polyacrylate
polyamide
polyethylene
ethylene-vinyl acetate copolymer
ethylene-acrylic acid-acrylate terpolymer
ethylene-acrylate-maleic anhydride terpolymer
polypropylene
polyimide
polymethacrylate
melamine resin, urethane resin, benzoguanine resin, phenolic resin
silicone resin
fluorinated polymers (PTFE, PVDF, . . . ), and
micronised waxes The use of a very finely divided polyethylene powder, which is, for example, currently marketed by DuPont PolymerPowders Switzerland under the trade name COATHYLENE HX® 1681, having relative particle diameters $d_{50}$ value of 10 µm, has proven particularly suitable in the experiments.

These particulate thickeners can be added to the etching medium in amounts of 1 to 50% by weight, advantageously in the range from 10 to 50% by weight, in particular from 25 to 35% by weight.

Also suitable in principle are particulate polymeric thickeners based on polystyrene
polyacrylate
polyamide
polyimide
polymethacrylate
melamine resin, urethane resin, benzoguanine resin, phenolic resin
silicone resin.

Etching media comprising inorganic, finely particulate powders selected from the group carbon black and graphite are distinguished, in particular, by significantly improved cleaning behaviour. After etching at temperatures up to 500° C., in particular up to 390° C., but also after doping at temperatures up to 1050° C., the residues of the etching media can be rinsed off in a simple manner without the need for subsequent rinsing since corresponding etching-paste residues advantageously detach from the surface in particulate form and can be rinsed off simply without re-depositing again elsewhere.

Compared with the particle-free etching pastes described in WO 01/83391 A, the addition of the particulate thickeners according to the invention has enabled the following improvements to be achieved:

I. The particulate thickening results in improved resilience of the etching medium. The particles form a skeleton-like structure in the etching medium. Similar structures are known to the person skilled in the art from highly disperse silicic acid (for example Aerosil®). In particular in screen or stencil printing of the etching pastes, a broadening of the printed structures due to flow can be substantially prevented or at least greatly restricted by the present invention. The printed, and thus paste-covered, area therefore corresponds substantially to the area specified in the screen or stencil layout.

Many inorganic particles, such as, for example, silicic acid or modified silicic acid, cannot be employed for thickening the etching medium owing to their reactivity with the etching component employed. For example, a chemical reaction of silicic acid with $NH_4HF_2$ takes place if the latter serves as etching component.

II. With the aid of particulate thickening, lines of greater print height with retained width are, in addition, printed on use of the same screen or stencil than on use of corresponding particle-free pastes, as described, for example, in WO 01/83391 A. This simultaneously results in a greater application rate of etching component per unit area. If relatively thick silicon dioxide or silicon nitride layers (>100 nm) are to be etched, this is a particular advantage for complete etching.

III. The more pronounced non-Newtonian or thixotropic properties of the novel etching pastes have a particularly advantageous effect for screen or stencil printing and result in considerably improved results. In particular, this is evident in a shortened etching time or an increased etching rate for the same etching time and especially in a greater etching depth in the case of relatively thick layers.

IV. The thickening associated with the addition of polymer particles according to the invention results in a considerably lower binding capacity of the etching paste. Given a specific choice of the particles added, an increased etching rate and thus a considerably increased etching depth are, surprisingly, achieved for the same amount of added etching component.

V. The significantly greater print height achieved under the same printing conditions, i.e. on use of the same screen and the same printing parameters, furthermore causes significantly delayed drying of the printed etching species. This enables the etching species to act on the substrate for longer. This is particularly important in the case of accelerated etching under elevated temperatures. In addition, the material remaining after the etching process can be removed significantly more easily in the final cleaning process, in particular since the paste residues detach from the surfaces in finely divided form.

Significant improvements in the present compositions arise, in particular, through considerably improved screen-printing behaviour, enabling continuous printing of surfaces to be treated without interruptions. The use of the etching pastes according to the invention enables considerably finer etching structures since the pastes have greater viscosities on addition of the same amounts of thickener in the presence of polymer particles. This enables the pastes to be applied in printing with a higher paste layer and consequently the layers to be etched more deeply. The improved rinsing behaviour (wafer cleaning) after etching also shortens the time required for subsequent cleaning. In addition, the amount of solvent or water required for the rinsing operation is reduced since residues of the etching media can be detached from the treated surface after the etching operation by the finely particulate inorganic powders present thereon and rinsed off without leaving a residue.

For the preparation of the compositions according to the invention, the solvents, etching components, thickeners, particles and additives are mixed successively with one another and stirred for a sufficient time until a viscous paste having thixotropic properties has formed. The stirring can be carried out with warming to a suitable temperature. The components are usually stirred with one another at room temperature.

Preferred uses of the printable etching pastes according to the invention arise for the described processes for the structuring of oxide layers applied to a support material, for the production of solar cells having a selective emitter layer on the light incidence side and for the production of solar cells having a selective emitter layer on the light incidence side and a back-surface field on the back.

For application to the areas to be treated, the etching pastes can be printed through a fine-mesh screen which contains the print stencil (or etched metal screens). In a further step, the pastes can be baked in the screen-printing process by the thick-layer method (screen printing of conductive metal pastes), enabling the electrical and mechanical properties to be fixed. On use of the etching pastes according to the invention, the baking (firing through the dielectric layers) can instead also be omitted and the applied etching pastes washed off with a suitable solvent or solvent mixture after a certain exposure time. The etching action is terminated by the washing-off.

Particularly suitable printing processes are essentially screen printing with screen separation or stencil printing without separation. In screen printing, the separation of a screen is usually several hundred μm with a tilt angle α between the edge of the squeegee, which pushes the etching printing paste over the screen, and the screen. The screen is held by a screen frame, while the squeegee is passed over the screen at a squeegee velocity v and a squeegee pressure P. In the process, the etching paste is pushed over the screen. During this operation, the screen comes into contact with the substrate in the form of a line over the squeegee width. The contact between screen and substrate transfers the vast majority of the screen printing paste located in the free screen meshes onto the substrate. In the areas covered by the screen meshes, no screen printing paste is transferred onto the substrate. This enables screen printing paste to be transferred in a targeted manner onto certain areas of the substrate.

After the end of the movement E, the squeegee is lifted off the screen. The screen is tensioned uniformly using a screen stretcher with a hydraulic/pneumatic tension and clamping device. The screen tension is monitored by defined sag of the screen in a certain area at a certain weight using a dial gauge. With specific pneumatic/hydraulic printing machines, the squeegee pressure (P), the printing velocity (V), the off-contact distance (a) and the squeegee path (horizontal and vertical, squeegee angle) can be set with various degrees of automation of the working steps for trial and production runs.

Printing screens used here usually consist of plastic or steel-wire cloth. It is possible for the person skilled in the art to select cloths having different wire diameters and mesh widths, depending on the desired layer thickness and line width. These cloths are structured directly or indirectly using photosensitive materials (emulsion layer). For the printing of extremely fine lines and in the case of requisite high precision of successive prints, it may be advantageous to use metal stencils, which are likewise provided directly or indirectly with a hole structure or line structure.

In order to carry out the etching, an etching paste, as described, for example, in Example 1, is prepared. Using an etching paste of this type, a thermal $SiO_2$ having a thickness of approx. 100 nm can be removed after screen printing. The etching is subsequently terminated by dipping the Si wafer into water and then rinsing with the aid of a fine water spray.

For the production of solar cells, wafers comprising p-doped Cz silicon having <100> orientation, for example, are selected. In these, a short, basic etching enables a structure to be produced on the surface which improves the light incidence geometry for reducing reflections. A thin dopant coating film comprising a boron-containing compound can be spin-coated onto the back and dried. The wafers prepared in this way are placed in a tray and introduced into an oven pre-heated to 1000 to 1100° C. An oxygen atmosphere is established in the oven, so that an oxide layer forms directly on all wafer surfaces that are not covered by the boron dopant coating film. At the same time, boron is expelled from the dopant coating film and diffuses into the back of the wafers. p+-doped regions with a depth of approx. 1 to 5 μm form. This embodiment of a solar cell is known to the person skilled in the art under the term "back-surface field". The oxide layers formed on the front can now be structured using the etching pastes described above.

For example, these oxide layers can be formed as masks for high n+ phosphorus dopings for the formation of selective emitter layers, while significantly less n+ doping is aimed at in the masked areas.

After opening of the pn junction, which would result in short circuits in the solar cell, for example by plasma etching or opening using a LASER beam, the electrical contacts are applied to the front and back of the cell. This can be carried out by means of two successive screen-printing steps using a paste, which may, besides the binders and oxidic additives, comprise conductive silver particles and/or aluminium. After the printing, the printed contacts are baked at about 700 to 800° C.

Compositions as described by this application are improved, printable etching pastes which can be employed extremely well for the etching of surfaces of glasses which comprise elements selected from the group calcium, sodium, aluminium, lead, lithium, magnesium, barium, potassium, boron, beryllium, phosphorus, gallium, arsenic, antimony, lanthanum, scandium, zinc, thorium, copper, chromium, manganese, iron, cobalt, nickel, molybdenum, vanadium, titanium, gold, platinum, palladium, silver, cerium, caesium, niobium, tantalum, zirconium, yttrium, neodymium and praseodymium.

In accordance with the invention, the novel etching pastes having thixotropic, non-Newtonian properties are used to structure silicon dioxide or nitride layers in a suitable manner during the process for the production of products for photovoltaics, semiconductor technology, high-performance electronics, of solar cells or photodiodes. Etching media having the composition described can in addition be employed in mineralogy or the glass industry and for the production of viewing windows for valves or measuring instruments, of glass supports for outdoor applications, for the production of etched glass surfaces in the medical, decorative and sanitary sectors, for the production of etched glass containers for cosmetic articles, foods and beverages, for the production of markings or labels on containers and in flat-glass production, for the structuring of glasses for flat-panel screen applications or for mineralogical, geological and microstructural investigations.

For the etching and doping of the surfaces to be treated, the compositions can be applied by screen, stencil, pad, stamp, ink-jet and manual printing processes. These are processes having a high degree of automation and high throughput. Manual application of the etching media according to the invention is likewise possible.

Owing to the particular physical properties, both at room temperature and also at elevated temperatures, the novel etching media are suitable for extremely demanding applications and can be employed for the production of glass supports for solar cells or for heat collectors. They can be used for the etching of $SiO_2$— or silicon nitride-containing glasses as uniform homogeneous non-porous and porous solids or of corresponding non-porous and porous glass layers of variable thickness which have been produced on other substrates. In this connection, these etching media are particularly suitable for the removal of silicon oxide/doped silicon oxide and silicon nitride layers, for the selective opening of passivation layers of silicon oxide and silicon nitride for the production of two-stage selective emitters and/or local $p^+$ back-surface fields in the process for the production of semiconductor components and integrated circuits thereof or of components for high-performance electronics. In these applications, the etching medium is applied over the entire area or selectively in a suitable manner in a single process step to the semiconductor surface to be etched, if necessary activated by input of energy, and removed again after an exposure time of 10 s-15 min, preferably after 30 s to 2 min. The etching can be carried out at elevated temperatures in the range from 30 to 500° C., preferably in the range from 200 to 450° C. The etching with the novel etching media according to the invention is very particularly preferably carried out in a temperature range from 320 to 390° C.

The media according to the invention can be applied over the entire area in a simple manner by methods known to the person skilled in the art. The novel media can also be applied selectively using an etch mask only to the areas where etching is desired. When etching of the entire area or in selectively printed areas is complete, doping can be carried out by further heating or the spent etching medium is rinsed off using a solvent or solvent mixture or burnt off by heating. The etching medium is preferably rinsed off with water when etching is complete.

The paste is usually printed onto the surface to be etched in a single process step and removed again after a pre-specified exposure time at suitable temperature. In this way, the surface is etched and structured in the printed areas, while unprinted areas are retained in the original state.

In this way, all masking and lithography steps otherwise necessary are superfluous. The etching operation can be carried out with or without input of energy, for example in the form of thermal radiation or with IR radiation.

The actual etching process is subsequently terminated by washing the surfaces with water and/or a suitable solvent. More precisely, the residues of the particle-containing etching media are rinsed off the etched and optionally doped surfaces using a suitable solvent when etching is complete.

The surface to be etched can, as already stated, be a surface or part-surface of silicon oxide- or silicon nitride-based glass and other silicon oxide- and silicon nitride-based systems, and/or a surface or part-surface of a porous and non-porous layer of glass and other silicon oxide- and silicon nitride-based systems on a support material.

During the application, the novel etching pastes described exhibit particularly advantageous properties compared with known compositions. In particular with respect to the surface cleaning following the etching operation, the novel formulations have more optimum properties. The improved properties become particularly clear on use of corresponding etching media in paste form.

It has been found that the pastes prepared exhibit improved properties, in particular, through the addition of finely particulate, inorganic powders (graphite and/or carbon black) and/or finely particulate organic powders (plastic powders), more precisely during printing, but also during and after the etching of $SiN_x$ or $SiO_2$ layers at temperatures between 320 and 400° C. An essential advantage of the novel etching media or paste formulations consists, in particular, in that the added inorganic powders do not melt at the high temperatures during the etching at 320-400° C. The active etching medium consequently only reacts in the desired areas. The novel etching media prove to be particularly advantageous during the cleaning of the etched and optionally doped surfaces. This is usually carried out using high-purity, deionised water (bidistilled water) in an ultrasound bath.

After the etching operation, the paste residues do not, like known etching pastes, detach from the treated surface in strips during cleaning, but instead decompose and are taken up in the cleaning water as fine particles. This advantage is found in particular for pastes to which at least one inorganic powder having a relative particle size <5 μm has been added.

Furthermore, the use of a salt-like additive (fluxing agent additive) in the etching paste enables significantly improved cleaning to be achieved. For this purpose, a fluxing agent additive which has a melting point <300° C. and a decomposition point >400° C. and which at the same time has very good water solubility is added to the paste. After the etching step at 320-390° C., the cooled paste residue can be detached significantly better during the subsequent rinsing operation.

Suitable fluxing agent additives have proven to be compounds selected from the group dimethylammonium chloride, diammonium hydrogenphosphate, diethylamine phosphate, urea, magnesium stearate, sodium acetate, triethanolamine hydrochloride and oxalic acid dihydrate. For this purpose, they can be added to the etching media individually or in the form of a mixture. In accordance with the invention, these fluxing agent additives may be present in the etching media in an amount of 0.05 to 25% by weight, based on the total amount. Media in which one or more fluxing agent additives are present in an amount of up to 17% by weight have particularly good properties in use.

These improved properties give rise to significant advantages for use of the etching media according to the invention in the mass production of solar cells compared with the use of conventional etching pastes since the paste residues can be removed in a simple manner in the cleaning step following the etching and detached paste residues do not remain on the surfaces to be treated and do not re-deposit from the cleaning water. This means that the cleaning operation can be optimised and the requisite amount of high-purity distilled water can be reduced.

Overall, the use of the compositions according to the invention for etching in the form of pastes thus enables large numbers of pieces to be etched and optionally doped inexpensively in a suitable automated process on an industrial scale.

For better understanding and for illustration, examples are given below which are within the scope of protection of the present invention, but are not suitable for restricting the invention to these examples. These examples also serve for the illustration of possible variants.

It goes without saying that, both in the examples given and also in the remainder of the description, the quoted percentage data of the components present in the compositions always add up to a total of 100% and not more.

EXAMPLES

Example 1

Etching Paste Consisting of a Particulate Thickener
465 g of phosphoric acid (85%)
are added with stirring to a solvent mixture consisting of
218 g of deionised water
223 g of 1-methyl-2-pyrrolidone
1.6 g of ethylene glycol
33 g of dimethylammonium chloride.
The mixture is subsequently stirred vigorously.
100 g of Vestosint 2070
are then added to the clear homogeneous mixture, which is stirred for a further 2 hours.

The paste, which is now ready to use, can be printed using a 280 mesh stainless-steel cloth screen. In principle, polyester or similar screen materials can also be used.

The etching paste prepared has proven to be stable on storage over a long period with retention of the advantageous etching properties.

Further examples of compositions according to the invention having advantageous properties are given in the annexed tables.

TABLE

| Batch | Triethylene glycol monomethyl ether [g] | H₂O [g] | Stabileze QM [g] | Polyethylene glycol [g] | PVP K90 [g] | Natrosol GR250 [g] | Vestosint PA 2070 [g] | Lactic acid (90%) [g] | H₃PO₄ (85%) [g] | 1-Methyl-2-pyrrolidone [g] | Ceridust 9202 F [g] | Carbon black [g] | Graphite [g] | Ethylene glycol [g] | Aerosil 200 [g] | PVP K30 [g] | Diammonium hydrogen-phosphate [g] | Diethylamine phosphate [g] | Dimethyl-ammonium chloride [g] |
|---|---|---|---|---|---|---|---|---|---|---|---|---|---|---|---|---|---|---|---|
| 1 | 0 | 218 | 8 | 0 | 0 | 8 | 0 | 0 | 465 | 223 | 275 | 19 | 0 | 0 | 0 | 0 | 0 | 0 | 33 |
| 2 | 0 | 219 | 7.7 | 0 | 0 | 8.5 | 0 | 0 | 463 | 223 | 276 | 17 | 0 | 0 | 0 | 0 | 0 | 0 | 35 |
| 3 | 0 | 220 | 7.4 | 0 | 0 | 9 | 0 | 0 | 461 | 223 | 277 | 15 | 0 | 24 | 0 | 0 | 0 | 0 | 37 |
| 4 | 0 | 221 | 7.1 | 0 | 0 | 9.5 | 0 | 0 | 459 | 223 | 278 | 13 | 0 | 2.8 | 0 | 0 | 0 | 0 | 39 |
| 5 | 0 | 222 | 6.8 | 0 | 0 | 10 | 0 | 0 | 457 | 223 | 279 | 11 | 0 | 3.2 | 0 | 0 | 0 | 0 | 41 |
| 6 | 0 | 223 | 6.5 | 0 | 0 | 10.5 | 0 | 0 | 455 | 223 | 280 | 9 | 0 | 3.6 | 0 | 0 | 0 | 0 | 43 |
| 7 | 0 | 224 | 6.2 | 0 | 0 | 11 | 0 | 0 | 453 | 223 | 281 | 7 | 0 | 3 | 0 | 0 | 0 | 0 | 34 |
| 8 | 0 | 225 | 5.9 | 0 | 0 | 11.5 | 0 | 0 | 451 | 223 | 282 | 8 | 0 | 2.4 | 0 | 0 | 0 | 0 | 25 |
| 9 | 0 | 226 | 5.6 | 0 | 0 | 12 | 0 | 0 | 449 | 223 | 283 | 9 | 0 | 1.8 | 0 | 0 | 0 | 0 | 16 |
| 10 | 0 | 227 | 5.3 | 0 | 0 | 12.5 | 0 | 0 | 447 | 223 | 284 | 10 | 0 | 1.2 | 0 | 0 | 0 | 0 | 17 |
| 11 | 0 | 228 | 5 | 0 | 0 | 13 | 0 | 0 | 445 | 223 | 285 | 11 | 0 | 0.6 | 0 | 0 | 0 | 0 | 18 |
| 12 | 0 | 229 | 4.7 | 0 | 0 | 13.5 | 0 | 0 | 443 | 223 | 286 | 12 | 0 | 0 | 0 | 0 | 0 | 0 | 19 |
| 13 | 0 | 0 | 0 | 0 | 0 | 0 | 0 | 0 | 450 | 466 | 302 | 13 | 0 | 0 | 0 | 60 | 0 | 0 | 76 |
| 14 | 0 | 0 | 0 | 0 | 0 | 0 | 0 | 0 | 452 | 464 | 291 | 19 | 0 | 0 | 0 | 59.5 | 0 | 0 | 100 |
| 15 | 0 | 0 | 0 | 0 | 0 | 0 | 0 | 0 | 454 | 462 | 280 | 25 | 0 | 0 | 0 | 59 | 0 | 0 | 124 |
| 16 | 0 | 0 | 0 | 0 | 0 | 0 | 0 | 0 | 456 | 460 | 269 | 31 | 0 | 0 | 0 | 58.5 | 0 | 0 | 123 |
| 17 | 0 | 0 | 0 | 0 | 0 | 0 | 0 | 0 | 458 | 458 | 258 | 37 | 0 | 0 | 0 | 58 | 0 | 0 | 122 |
| 18 | 0 | 0 | 0 | 0 | 0 | 0 | 0 | 0 | 460 | 456 | 247 | 43 | 0 | 0 | 0 | 57.5 | 0 | 0 | 121 |
| 19 | 0 | 0 | 0 | 0 | 0 | 0 | 0 | 0 | 462 | 454 | 236 | 49 | 0 | 0 | 0 | 57 | 0 | 0 | 120 |
| 20 | 0 | 0 | 0 | 0 | 0 | 0 | 0 | 0 | 464 | 452 | 225 | 55 | 0 | 0 | 0 | 56.5 | 0 | 0 | 119 |
| 21 | 0 | 0 | 0 | 0 | 0 | 0 | 0 | 0 | 450 | 466 | 214 | 61 | 0 | 0 | 0 | 60 | 0 | 0 | 118 |
| 22 | 0 | 0 | 0 | 0 | 0 | 0 | 0 | 0 | 452 | 464 | 203 | 67 | 0 | 0 | 0 | 59.5 | 0 | 0 | 119 |
| 23 | 0 | 0 | 0 | 0 | 0 | 0 | 0 | 0 | 454 | 462 | 192 | 73 | 0 | 0 | 0 | 59 | 0 | 0 | 120 |
| 24 | 0 | 0 | 0 | 0 | 0 | 0 | 0 | 0 | 456 | 460 | 181 | 79 | 0 | 0 | 0 | 58.5 | 0 | 0 | 121 |
| 25 | 0 | 0 | 0 | 0 | 0 | 0 | 0 | 0 | 458 | 458 | 170 | 85 | 0 | 0 | 0 | 58 | 0 | 0 | 122 |
| 26 | 0 | 0 | 0 | 0 | 0 | 0 | 0 | 0 | 460 | 456 | 252 | 68 | 0 | 0 | 0 | 57.5 | 0 | 0 | 130 |
| 27 | 0 | 0 | 0 | 0 | 0 | 0 | 0 | 0 | 462 | 454 | 249 | 51 | 0 | 0 | 0 | 57 | 0 | 0 | 138 |
| 28 | 0 | 0 | 0 | 0 | 0 | 0 | 0 | 0 | 464 | 452 | 246 | 50 | 0 | 0 | 0 | 56.5 | 0 | 0 | 146 |
| 29 | 1 | 0 | 0 | 0 | 0 | 0 | 0 | 0 | 466 | 450 | 243 | 49 | 0 | 0 | 0 | 56 | 0 | 0 | 154 |
| 30 | 2 | 0 | 0 | 0 | 0 | 0 | 0 | 0 | 468 | 448 | 240 | 48 | 0 | 0 | 0 | 55.5 | 0 | 0 | 162 |
| 31 | 2 | 0 | 0 | 0 | 0 | 0 | 0 | 0 | 470 | 446 | 237 | 47 | 0 | 0 | 0 | 55 | 0 | 0 | 170 |
| 32 | 0 | 218 | 8 | 0 | 0 | 8 | 0 | 0 | 465 | 223 | 275 | 0 | 19 | 1.6 | 0 | 0 | 0 | 33 | 0 |
| 33 | 0 | 219 | 7.7 | 0 | 0 | 8.5 | 0 | 0 | 463 | 223 | 276 | 0 | 17 | 2 | 0 | 0 | 0 | 35 | 0 |
| 34 | 0 | 220 | 7.4 | 0 | 0 | 9 | 0 | 0 | 461 | 223 | 277 | 0 | 15 | 2.4 | 0 | 0 | 0 | 37 | 0 |
| 35 | 0 | 221 | 7.1 | 0 | 0 | 9.5 | 0 | 0 | 459 | 223 | 278 | 0 | 13 | 2.8 | 0 | 0 | 0 | 39 | 0 |
| 36 | 0 | 222 | 6.8 | 0 | 0 | 10 | 0 | 0 | 457 | 223 | 279 | 0 | 11 | 3.2 | 0 | 0 | 0 | 41 | 0 |
| 37 | 0 | 223 | 6.5 | 0 | 0 | 10.5 | 0 | 0 | 455 | 223 | 280 | 0 | 9 | 3.6 | 0 | 0 | 0 | 43 | 0 |
| 38 | 0 | 224 | 6.2 | 0 | 0 | 11 | 0 | 0 | 453 | 223 | 281 | 0 | 7 | 3 | 0 | 0 | 0 | 34 | 0 |
| 39 | 0 | 225 | 5.9 | 0 | 0 | 11.5 | 0 | 0 | 451 | 223 | 282 | 0 | 8 | 2.4 | 0 | 0 | 0 | 25 | 0 |
| 40 | 0 | 226 | 5.6 | 0 | 0 | 12 | 0 | 0 | 449 | 223 | 283 | 0 | 9 | 1.8 | 0 | 0 | 0 | 16 | 0 |
| 41 | 0 | 227 | 5.3 | 0 | 0 | 12.5 | 0 | 0 | 447 | 223 | 284 | 0 | 10 | 1.2 | 0 | 0 | 0 | 17 | 0 |
| 42 | 0 | 228 | 5 | 0 | 0 | 13 | 0 | 0 | 445 | 223 | 285 | 0 | 11 | 0.6 | 0 | 0 | 0 | 18 | 0 |
| 43 | 0 | 229 | 4.7 | 0 | 0 | 13.5 | 0 | 0 | 443 | 223 | 286 | 0 | 12 | 0 | 0 | 0 | 0 | 19 | 0 |
| 44 | 0 | 0 | 0 | 0 | 0 | 0 | 0 | 0 | 450 | 466 | 302 | 0 | 13 | 0 | 0 | 60 | 0 | 76 | 0 |
| 45 | 0 | 0 | 0 | 0 | 0 | 0 | 0 | 0 | 452 | 464 | 291 | 0 | 19 | 0 | 0 | 59.5 | 0 | 100 | 0 |
| 46 | 0 | 0 | 0 | 0 | 0 | 0 | 0 | 0 | 454 | 462 | 280 | 0 | 25 | 0 | 0 | 59 | 0 | 124 | 0 |
| 47 | 0 | 0 | 0 | 0 | 0 | 0 | 0 | 0 | 456 | 460 | 269 | 0 | 31 | 0 | 0 | 58.5 | 0 | 123 | 0 |

TABLE-continued

| Batch | Triethylene glycol monomethyl ether [g] | H₂O [g] | Stabileze QM [g] | Polyethylene glycol [g] | PVP K90 [g] | Natrosol GR250 [g] | Vestosint PA 2070 [g] | Lactic acid (90%) [g] | H₃PO₄ (85%) [g] | 1-Methyl-2-pyrrolidone [g] | Ceridust 9202 F [g] | Carbon black [g] | Graphite [g] | Ethylene glycol [g] | Aerosil 200 [g] | PVP K30 [g] | Diammonium hydrogenphosphate [g] | Diethylamine phosphate [g] | Dimethylammonium chloride [g] |
|---|---|---|---|---|---|---|---|---|---|---|---|---|---|---|---|---|---|---|---|
| 48 | 0 | 0 | 0 | 0 | 0 | 0 | 0 | 0 | 458 | 458 | 258 | 0 | 37 | 0 | 0 | 58 | 0 | 122 | 0 |
| 49 | 0 | 0 | 0 | 0 | 0 | 0 | 0 | 0 | 460 | 456 | 247 | 0 | 43 | 0 | 0 | 57.5 | 0 | 121 | 0 |
| 50 | 0 | 0 | 0 | 0 | 0 | 0 | 0 | 0 | 462 | 454 | 236 | 0 | 49 | 0 | 0 | 57 | 0 | 120 | 0 |
| 51 | 0 | 0 | 0 | 0 | 0 | 0 | 0 | 0 | 464 | 452 | 225 | 0 | 55 | 0 | 0 | 56.5 | 0 | 119 | 0 |
| 52 | 0 | 0 | 0 | 0 | 0 | 0 | 0 | 0 | 450 | 466 | 214 | 0 | 61 | 0 | 0 | 60 | 0 | 118 | 0 |
| 53 | 0 | 0 | 0 | 0 | 0 | 0 | 0 | 0 | 452 | 464 | 203 | 0 | 67 | 0 | 0 | 59.5 | 0 | 119 | 0 |
| 54 | 0 | 0 | 0 | 0 | 0 | 0 | 0 | 0 | 454 | 462 | 192 | 0 | 73 | 0 | 0 | 59 | 0 | 120 | 0 |
| 55 | 0 | 0 | 0 | 0 | 0 | 0 | 0 | 0 | 456 | 460 | 181 | 0 | 79 | 0 | 0 | 58.5 | 0 | 121 | 0 |
| 56 | 0 | 0 | 0 | 0 | 0 | 0 | 0 | 0 | 458 | 458 | 170 | 0 | 85 | 0 | 0 | 58 | 0 | 122 | 0 |
| 57 | 0 | 0 | 0 | 0 | 0 | 0 | 0 | 0 | 460 | 456 | 252 | 0 | 68 | 0 | 0 | 57.5 | 0 | 130 | 0 |
| 58 | 0 | 0 | 0 | 0 | 0 | 0 | 0 | 0 | 462 | 454 | 249 | 0 | 51 | 0 | 0 | 57 | 0 | 138 | 0 |
| 59 | 0 | 0 | 0 | 0 | 0 | 0 | 0 | 0 | 464 | 452 | 246 | 0 | 50 | 0 | 0 | 56.5 | 0 | 146 | 0 |
| 60 | 0 | 0 | 0 | 0 | 0 | 0 | 0 | 0 | 466 | 450 | 243 | 0 | 49 | 0 | 0 | 56 | 0 | 154 | 0 |
| 61 | 1 | 0 | 0 | 0 | 0 | 0 | 0 | 0 | 468 | 448 | 240 | 0 | 48 | 0 | 0 | 55.5 | 0 | 162 | 0 |
| 62 | 2 | 0 | 0 | 0 | 0 | 0 | 0 | 0 | 470 | 446 | 237 | 0 | 47 | 0 | 0 | 55 | 0 | 170 | 0 |
| 63 | 2 | 218 | 8 | 0 | 0 | 8 | 0 | 0 | 465 | 223 | 275 | 0 | 0 | 1.6 | 19 | 0 | 33 | 0 | 0 |
| 64 | 0 | 219 | 7.7 | 0 | 0 | 8.5 | 0 | 0 | 463 | 223 | 276 | 0 | 0 | 2 | 17 | 0 | 35 | 0 | 0 |
| 65 | 0 | 220 | 7.4 | 0 | 0 | 9 | 0 | 0 | 461 | 223 | 277 | 0 | 0 | 2.4 | 15 | 0 | 37 | 0 | 0 |
| 66 | 0 | 221 | 7.1 | 0 | 0 | 9.5 | 0 | 0 | 459 | 223 | 278 | 0 | 0 | 2.8 | 13 | 0 | 39 | 0 | 0 |
| 67 | 0 | 222 | 6.8 | 0 | 0 | 10 | 0 | 0 | 457 | 223 | 279 | 0 | 0 | 3.2 | 11 | 0 | 41 | 0 | 0 |
| 68 | 0 | 223 | 6.5 | 0 | 0 | 10.5 | 0 | 0 | 455 | 223 | 280 | 0 | 0 | 3.6 | 9 | 0 | 43 | 0 | 0 |
| 69 | 0 | 224 | 6.2 | 0 | 0 | 11 | 0 | 0 | 453 | 223 | 281 | 0 | 0 | 3 | 7 | 0 | 34 | 0 | 0 |
| 70 | 0 | 225 | 5.9 | 0 | 0 | 11.5 | 0 | 0 | 451 | 223 | 282 | 0 | 0 | 2.4 | 8 | 0 | 25 | 0 | 0 |
| 71 | 0 | 226 | 5.6 | 0 | 0 | 12 | 0 | 0 | 449 | 223 | 283 | 0 | 0 | 1.8 | 9 | 0 | 16 | 0 | 0 |
| 72 | 0 | 227 | 5.3 | 0 | 0 | 12.5 | 0 | 0 | 447 | 223 | 284 | 0 | 0 | 1.2 | 10 | 0 | 17 | 0 | 0 |
| 73 | 0 | 228 | 5 | 0 | 0 | 13 | 0 | 0 | 445 | 223 | 285 | 0 | 0 | 0.6 | 11 | 0 | 18 | 0 | 0 |
| 74 | 0 | 229 | 4.7 | 0 | 0 | 13.5 | 0 | 0 | 443 | 223 | 286 | 0 | 0 | 0 | 12 | 0 | 19 | 0 | 0 |
| 75 | 0 | 0 | 0 | 0 | 0 | 0 | 0 | 0 | 450 | 466 | 302 | 0 | 0 | 0 | 13 | 60 | 76 | 0 | 0 |
| 76 | 0 | 0 | 0 | 0 | 0 | 0 | 0 | 0 | 452 | 464 | 291 | 0 | 0 | 0 | 19 | 59.5 | 100 | 0 | 0 |
| 77 | 0 | 0 | 0 | 0 | 0 | 0 | 0 | 0 | 454 | 462 | 280 | 0 | 0 | 0 | 25 | 59 | 124 | 0 | 0 |
| 78 | 0 | 0 | 0 | 0 | 0 | 0 | 0 | 0 | 456 | 460 | 269 | 0 | 0 | 0 | 31 | 58.5 | 123 | 0 | 0 |
| 79 | 0 | 0 | 0 | 0 | 0 | 0 | 0 | 0 | 458 | 458 | 258 | 0 | 0 | 0 | 37 | 58 | 122 | 0 | 0 |
| 80 | 0 | 0 | 0 | 0 | 0 | 0 | 0 | 0 | 460 | 456 | 247 | 0 | 0 | 0 | 43 | 57.5 | 121 | 0 | 0 |
| 81 | 0 | 0 | 0 | 0 | 0 | 0 | 0 | 0 | 462 | 454 | 236 | 0 | 0 | 0 | 49 | 57 | 120 | 0 | 0 |
| 82 | 0 | 0 | 0 | 0 | 0 | 0 | 0 | 0 | 464 | 452 | 225 | 0 | 0 | 0 | 55 | 56.5 | 119 | 0 | 0 |
| 83 | 0 | 0 | 0 | 0 | 0 | 0 | 0 | 0 | 450 | 466 | 214 | 0 | 0 | 0 | 61 | 60 | 118 | 0 | 0 |
| 84 | 0 | 0 | 0 | 0 | 0 | 0 | 0 | 0 | 452 | 464 | 203 | 0 | 0 | 0 | 67 | 59.5 | 119 | 0 | 0 |
| 85 | 0 | 0 | 0 | 0 | 0 | 0 | 0 | 0 | 454 | 462 | 192 | 0 | 0 | 0 | 73 | 59 | 120 | 0 | 0 |
| 86 | 0 | 0 | 0 | 0 | 0 | 0 | 0 | 0 | 456 | 460 | 181 | 0 | 0 | 0 | 79 | 58.5 | 121 | 0 | 0 |
| 87 | 0 | 0 | 0 | 0 | 0 | 0 | 0 | 0 | 458 | 458 | 170 | 0 | 0 | 0 | 85 | 58 | 122 | 0 | 0 |
| 88 | 0 | 0 | 0 | 0 | 0 | 0 | 0 | 0 | 460 | 456 | 252 | 0 | 0 | 0 | 68 | 57.5 | 130 | 0 | 0 |
| 89 | 0 | 0 | 0 | 0 | 0 | 0 | 0 | 0 | 462 | 454 | 249 | 0 | 0 | 0 | 51 | 57 | 138 | 0 | 0 |
| 90 | 0 | 0 | 0 | 0 | 0 | 0 | 0 | 0 | 464 | 452 | 246 | 0 | 0 | 0 | 50 | 56.5 | 146 | 0 | 0 |
| 91 | 1 | 0 | 0 | 0 | 0 | 0 | 0 | 0 | 466 | 450 | 243 | 0 | 0 | 0 | 49 | 56 | 154 | 0 | 0 |
| 92 | 2 | 0 | 0 | 0 | 0 | 0 | 0 | 0 | 468 | 448 | 240 | 0 | 0 | 0 | 48 | 55.5 | 162 | 0 | 0 |
| 93 | 2 | 0 | 0 | 0 | 0 | 0 | 0 | 0 | 470 | 446 | 237 | 0 | 0 | 0 | 47 | 55 | 170 | 0 | 0 |

The invention claimed is:

1. A method for the etching of extremely fine lines or structures in a silicon oxide, silicon nitride or glass layer or for the doping of a silicon oxide, silicone nitride or glass layer comprising applying a printable composition in the form of paste onto said layer, wherein the printable composition in the form of a paste comprises:
   a finely particulate inorganic powder of graphite and/or carbon black having a relative particle diameter of less than 5 µm;
   a finely particulate organic powder in the form of a finely particulate plastic powder having a relative particle diameter in the range from 10 nm to 50 µm selected from the group of polystyrenes, polyacrylates, polyamides, polyimides, polymethacrylates, melamine resin, urethane resin, benzoguanine resin, phenolic resin, silicone resins, micronised cellulose, fluorinated polymers (PTFE, PVDF) and micronised waxes;
   optionally, a finely particulate inorganic powder selected from the group of aluminum oxide, calcium fluoride, boron oxide, sodium chloride;
   one or more forms of phosphoric acid, a phosphoric acid salt or a compound which decomposes to the corresponding phosphoric acid, or at least one of hydrochloric acid, sulfuric acid or nitric acid, as etching component; and
   optionally, at least one organic acid selected from the group of alkylcarboxylic acids, hydroxycarboxylic acids and dicarboxylic acids.

2. A method of claim 1, wherein said printable composition in the form of a paste comprises said finely particulate plastic powder have a relative diameter in the range from 10 nm to 50 µm.

3. A method of claim 1, wherein said printable composition in the form of a paste comprises said finely particulate plastic powder have a relative particle diameter in the range from 100 nm to 30 µm.

4. A method of claim 1, wherein said printable composition in the form of a past comprises said finely particulate plastic powder have a relative particle diameter in the range from 1 µm to 10 µm.

5. A method of claim 1, which comprises etching of $SiO_2$— or silicon nitride-containing glasses as uniform homogeneous non-porous or porous solids or of a corresponding non-porous and porous glass layer of variable thickness which have been produced on another substrate by applying said printable composition in the form of a paste thereto.

6. A method of claim 1, which comprises the removal of silicon oxide, doped silicon oxide and silicon nitride layers, for the selective opening of passivation layers of silicon oxide and silicon nitride for the production of two-stage selective emitters and/or local p+ back-surface fields in a process for the production of semiconductor components and integrated circuits thereof or of components for high-performance electronics.

7. A method of claim 1, wherein the printable composition in the form of a paste is applied to a glass layer which comprises an element selected from the group consisting of: calcium, sodium, aluminum, lead, lithium, magnesium, barium, potassium, boron, beryllium, phosphorus, gallium, arsenic, antimony, lanthanum, scandium, zinc, thorium, copper, chromium, manganese, iron, cobalt, nickel, molybdenum, vanadium, titanium, gold, platinum, palladium, silver, cerium, caesium, niobium, tantalum, zirconium, yttrium, neodymium and praseodymium.

8. A method of claim 1, wherein the printable composition in the form of a paste is applied to the layer for etching or doping in an application of: photovoltaics, semiconductor technology, high-performance electronics, mineralogy or the glass industry; for the production of: photodiodes, viewing windows for valves or measuring instruments, glass supports for outdoor applications, etched glass surfaces in the medical, decorative or sanitary sectors, etched glass containers for cosmetic articles, foods or beverages, markings or labels on containers, flat-glass, or glasses for flat-panel screen applications; or for conducting mineralogical, geological and microstructural investigations.

9. A method of claim 1, wherein the printable composition in the form of a paste is applied to the layer for etching or doping in applications for the production of glass supports for solar cells or for heat collectors.

10. A method of claim 1, wherein the printable composition in the form of a paste is applied to the layer by a screen, stencil, pad, stamp, ink-jet or manual printing process.

11. The method of claim 1, wherein the printable composition in the form of a paste is applied over the entire area or selectively in extremely fine lines or structures to a semiconductor surface to be etched, optionally activated by input of energy, and removed again after an exposure time of 10 seconds to 15 minutes.

12. The method of claim 1, wherein the printable composition in the form of a paste is applied over the entire area or selectively in extremely fine lines or structures to a semiconductor surface to be etched, optionally activated by input of energy, and removed again after an exposure time of 30 seconds to 2 minutes.

13. The method of claim 11, wherein the printable composition in the form of a paste is applied over the entire area or in accordance with an etch structure mask specifically only to the areas where etching and/or doping is desired, and, when etching is complete and optionally after doping by further heating, rinsed off using a solvent or solvent mixture or burnt off by heating.

14. The method of claim 13, wherein the printable composition in the form of a paste is rinsed off with water when etching is complete.

15. The method of claim 11, wherein the etching is carried out at temperatures in the range from 30 to 500° C.

16. The method of claim 11, wherein the etching is carried out at temperatures in the range from 200 to 450° C.

17. The method of claim 11, wherein the etching is carried out at temperatures in the range from 320 to 390° C.

* * * * *

UNITED STATES PATENT AND TRADEMARK OFFICE
CERTIFICATE OF CORRECTION

Page 1 of 1

PATENT NO. : 8,143,172 B2
APPLICATION NO. : 11/995618
DATED : March 27, 2012
INVENTOR(S) : Werner Stockum et al.

It is certified that error appears in the above-identified patent and that said Letters Patent is hereby corrected as shown below:

In the Claims:

Column 19, line 6 (Claim 1), reads: "paste onto said layer, wherein the printable composition in the" It should read: -- a paste onto said layer, wherein the printable composition in the --.

Column 19, line 21 (Claim 1), reads: "boron oxide, sodium chloride;"
It should read: -- boron oxide, and sodium chloride; --.

Column 19, line 39 (Claim 4), reads: "in the form of a past comprises said finely particulate plastic"
It should read: -- in the form of a paste comprises said finely particulate plastic --.

Signed and Sealed this
Fourteenth Day of August, 2012

David J. Kappos
*Director of the United States Patent and Trademark Office*